(12) United States Patent
Kropp et al.

(10) Patent No.: US 6,258,497 B1
(45) Date of Patent: Jul. 10, 2001

(54) PRECISE ENDPOINT DETECTION FOR ETCHING PROCESSES

(75) Inventors: Lawrence Andrew Kropp, Pleasant Valley; David Stanasolovich, Montgomery, both of NY (US); Marc Jay Weiss, Fairfield, CT (US); Dennis Sek-On Yee, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/448,955

(22) Filed: May 24, 1995

Related U.S. Application Data

(62) Division of application No. 08/375,138, filed on Jan. 19, 1995, now abandoned, which is a continuation of application No. 07/921,540, filed on Jul. 29, 1992, now abandoned.

(51) Int. Cl.$^7$ .................................................. H01L 21/306
(52) U.S. Cl. ...................... 430/30; 430/313; 204/192.33; 216/60; 216/87; 427/539; 438/8; 438/9; 438/737; 438/710
(58) Field of Search .............................. 156/625.1, 643.1, 156/626.1, 646.1; 427/569, 585, 539, 530, 529; 204/192.33; 216/59, 60, 87, 203; 430/30, 313, 323; 438/8, 9, 694, 710, 737

(56) References Cited

U.S. PATENT DOCUMENTS

| | | | |
|---|---|---|---|
| 4,741,919 | 5/1988 | Takasaki | 427/38 |
| 4,839,311 | 6/1989 | Riley et al. | 437/228 |
| 4,842,683 | 6/1989 | Cheng et al. | 156/643.1 |
| 4,846,928 | 7/1989 | Dolins et al. | 156/626.1 |
| 4,847,792 | 7/1989 | Barna et al. | |
| 4,861,419 | 8/1989 | Flinchbaugh et al. | 156/626.1 |
| 4,918,031 | * 4/1990 | Flamm et al. | 437/225 |
| 4,946,550 | 8/1990 | Van Laarhoven | 156/643.1 |
| 5,021,121 | 6/1991 | Groechel et al. | 156/643.1 |
| 5,160,397 | 11/1992 | Doki et al. | 156/345.11 |
| 5,283,202 | * 2/1994 | Pike, Jr. et al. | 437/31 |
| 5,367,139 | * 11/1994 | Bennett et al. | 219/121.59 |

FOREIGN PATENT DOCUMENTS

| | | | |
|---|---|---|---|
| 0062302 | * 10/1982 | (EP) | 216/60 |
| 55-85624 | * 6/1980 | (JP) | |
| 60-251626 | * 12/1985 | (JP) | 216/60 |
| 3241752 | * 10/1991 | (JP) | |

OTHER PUBLICATIONS

Translation of JP 3–241752.*

* cited by examiner

Primary Examiner—Martin Angebranndt
(74) Attorney, Agent, or Firm—McGuireWoods, LLP; Joseph P. Abate

(57) ABSTRACT

A homogeneous marker is formed, possibly by the adsorption of trace amounts of an ambient material such as carbon monoxide gas, at a surface of a deposited material when the plasma in momentarily interrupted during plasma enhanced chemical vapor deposition or other deposition processes involving the presence of a plasma. When the deposited material is etched, the resulting crystal dislocations or adsorbed gas is detected as a marker by optical emission spectroscopy techniques. The accuracy of an end point determination of the etching process can be increased by providing a sequence of such markers within the bulk or volume of the deposited material. The markers, being merely an interface such as a slight crystal dislocation in otherwise homogeneous material, do not affect the electrical, chemical or optical properties of the remainder of the predetermined deposited material and thus the homogeneity of the deposited material is not significantly affected.

14 Claims, 2 Drawing Sheets

PRECISE ENDPOINT DETECTION FOR ETCHING PROCESSES

CROSS REFERENCE TO RELATED APPLICATION

This application is a division of application Ser. No. 08/375,138 filed Jan. 19, 1995 now abandoned, which is a continuation of application Ser. No. 07/921,540, filed Jul. 29, 1992, now abandoned.

BACKGROUND OF THE INVENTION

1. Field of the Invention

The present invention generally relates to etching processes and, more particularly, to precision etching of deposited material in semiconductor structures.

2. Description of the Prior Art

Due to the small size of elements of integrated circuits and the small minimum feature size of patterns of materials of which they are formed, many manufacturing process steps simultaneously deposit materials on or etch materials away from a plurality of masked areas over the entire surface of a chip or wafer. Many current, high performance semiconductor device designs also require the formation of layers of very precise thicknesses. Such thicknesses of material are usually formed by depositing a thicker layer and then etching it to the desired thickness. Such a technique allows more reliable formation of the layer which may not be continuous if merely deposited to the desired thickness.

Among etching techniques, reactive ion etching (RIE) is very desirable due to its relatively high speed and uniformity of action.

However, the relatively high speed of the process decreases the accuracy with which the process may be controlled. Further, the speed of etching, while generally relatively constant during a particular process, may vary widely from process to process. Further, the reactive ion etch process generally take a short but variable time to stabilize, once started, which increases the uncertainty as to the progress of the etching process. For these reasons, a 15% accuracy of final layer thickness is regarded as the best accuracy obtainable from reactive ion etching under so-called blind etching or timed etching circumstances. This accuracy is insufficient to support the desired degree of consistency of integrated circuit element performance or even consistently high yield.

Because of this uncertainty, so-called etch stops have been used in some circumstances to effectively terminate the etching process. An etch stop is essentially a thin layer which exhibits an etching rate which is very slow in comparison with the etch rate of another material. The timed etch can then be conducted to completely remove the material above the etch stop and the etching process halted before the etch stop material is significantly removed. This approach, however, does not provide a solution to the above problem since the etched material is entirely removed and the etch stop material may not have the desired electrical properties.

Optical emission spectroscopy (OES) is known and has been used to study the etching process by allowing the determination of materials in plasmas during the etching process. Thus, one potential solution to the problem of termination of etching to leave a desired thickness of material is to apply layers of different materials to provide several interfaces which then serve as etching markers. For instance, applying a three layer insulator of respective oxide, nitride and oxide layers to form a so-called ONO insulator could be done. Then, during etching, removal of all the nitride could be theoretically detected by OES techniques and etching terminated after a suitable degree of etching of the last oxide layer. This approach has several significant drawbacks, however. The development of a three layer structure, itself requires a plurality of process steps and is expensive and time-consuming. The etching of several layers of substantial thickness is also time consuming. Any material added to the plasma from the etched surface may be redeposited and form undesired deposits or otherwise contaminate the semiconductor structure. The potential improvement of accuracy is not large since there is uncertainty as to the thickness of the oxide layers, as deposited. Further, the volume of nitride material removed and placed in the plasma does not allow precise determination of the completion of the removal of the nitride layer. Finally, the ONO insulator and other layered structures are, by definition, inhomogeneous and may have electrical or optical properties which are undesirable or otherwise conflict with device designs.

SUMMARY OF THE INVENTION

It is therefore an object of the present invention to provide a technique of determining, with high accuracy, a desired end point of a reactive ion etch process to leave a predetermined thickness of material.

It is another object of the invention to provide an etching marker within a body of material to be etched which is unambiguous and does not introduce significant inhomogeneity into the material or otherwise affect its properties.

It is a further object of the invention to provide an etching marker which does not require a multi-material deposition process.

In order to accomplish these and other objects of the invention, a homogeneous marker is provided, formed by a process including the steps of depositing a layer of a predetermined material on a surface in the presence of a plasma and periodically interrupting the plasma in the presence of at least one ambient material other than said predetermined material.

In accordance with another aspect of the invention, a method of fabricating a semiconductor device is provided including the steps of depositing a layer of a predetermined material on a surface in the presence of a plasma, periodically interrupting the plasma in the presence of at least one ambient material other than said predetermined material, etching the predetermined material by reactive ion etching while monitoring optical emissions from a plasma, and terminating the etching process based on changes in said optical emissions of the plasma.

In accordance with a further aspect of the invention, a method of determining an end point of a reactive ion etching process is provided including the steps of forming a plurality of homogeneous markers within the bulk of a layer of a predetermined material, and observing changes of optical emissions from a plasma during reactive ion etching of the predetermined material.

In accordance with yet another aspect of the invention, a homogeneous marker is provided, formed within a volume of a predetermined deposited material including an interface formed by crystal dislocations.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
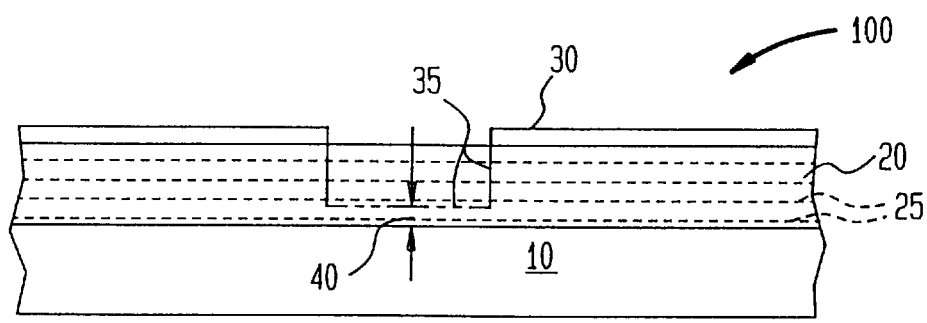
FIG. 1 is a cross-sectional view of a layer to be etched and an underlying layer in accordance with the invention, FIG. 2 graphically depicts the optical emission spectroscopy output as a function of time during a reactive ion etching process.

Referring now to the drawings, and more particularly to FIG. 1, there is shown a cross section of a structure 100 upon which etching is to be performed in accordance with the present invention. This structure comprises a layer 20 to be etched over an underlying layer 10 and a mask 30 which defines the lateral extent of the etching. The region of layer 20 to be etched away is shown by chain line 35 and leaves a thin region 40 of layer 20. The particular materials of layers 10 and 20 are not important to the principles or practice of the invention. However, in the presently contemplated applications of the invention, region 40 may form the base of a bipolar transistor, in which case layer 20 could be polysilicon, or the gate insulator of a field-effect transistor, in which case layer 20 would be an insulator such as silicon oxide. The thickness of such a layer is critical to performance in both of these types of devices. Performance is degraded if the layer is of increased thickness and the transistor may be destroyed or the breakdown voltages markedly decreased if the layer is of reduced thickness. The invention is also applicable to other group III-V semiconductors and could be used to form thin layers for wave guides in semiconductor lasers and superluminescent diodes.

The inventors have discovered that trace amounts of ambient gases are adsorbed onto a surface on which material is being deposited at the beginning of a plasma enhanced chemical vapor deposition process (PECVD). This same adsorption will occur at any point during material deposition when the plasma is interrupted and restarted. When the deposited material is etched away, the gases reappear momentarily when a depth corresponding to a plasma interruption is reached. Therefore, in accordance with the invention, if the plasma is interrupted at known, preferably equal, time intervals for about one second each, a plurality of locations of adsorbed gases disposed at known, preferably equal intervals over the depth of the deposit, as are indicated by dashed lines 25.

The reaching of these locations of adsorbed gases can be observed as sharp spikes in the emission spectrum of the plasma by OES methods which are sufficiently well-understood in the art for the making of this observation. Thus to form thin region 40, layer 20 should be deposited by a PECVD process with the plasma being interrupted for about one second at each of preferably about five equally separated intervals. The interval is chosen to be slightly less than (preferably about two-thirds) the duration of deposition required to form the desired final thickness of region 40. It is to be noted that the trace amounts of ambient gases do not usually form a layer but nevertheless constitute an extremely thin interface between portions of the predetermined deposited material. This interface generally appears as only a slight dislocation of the crystal structure. Therefore such interfaces do not affect the properties, including optical properties and etching rates, of layer 20 in any significant way. Accordingly, these locations are well-described as homogeneous endpoints or markers. Therefore it is possible to leave one or more locations of adsorbed gases in place within region 40. In this way, at least a known thickness of layer 20 will remain and inspection and/or testing of the thickness of region 40 may be omitted. As many as five such locations within the bulk of a deposited silicon oxide insulator have produced no detectable effect on the refractive index dielectric constant, uniformity or current or voltage leakage of the material.

Figure 2:
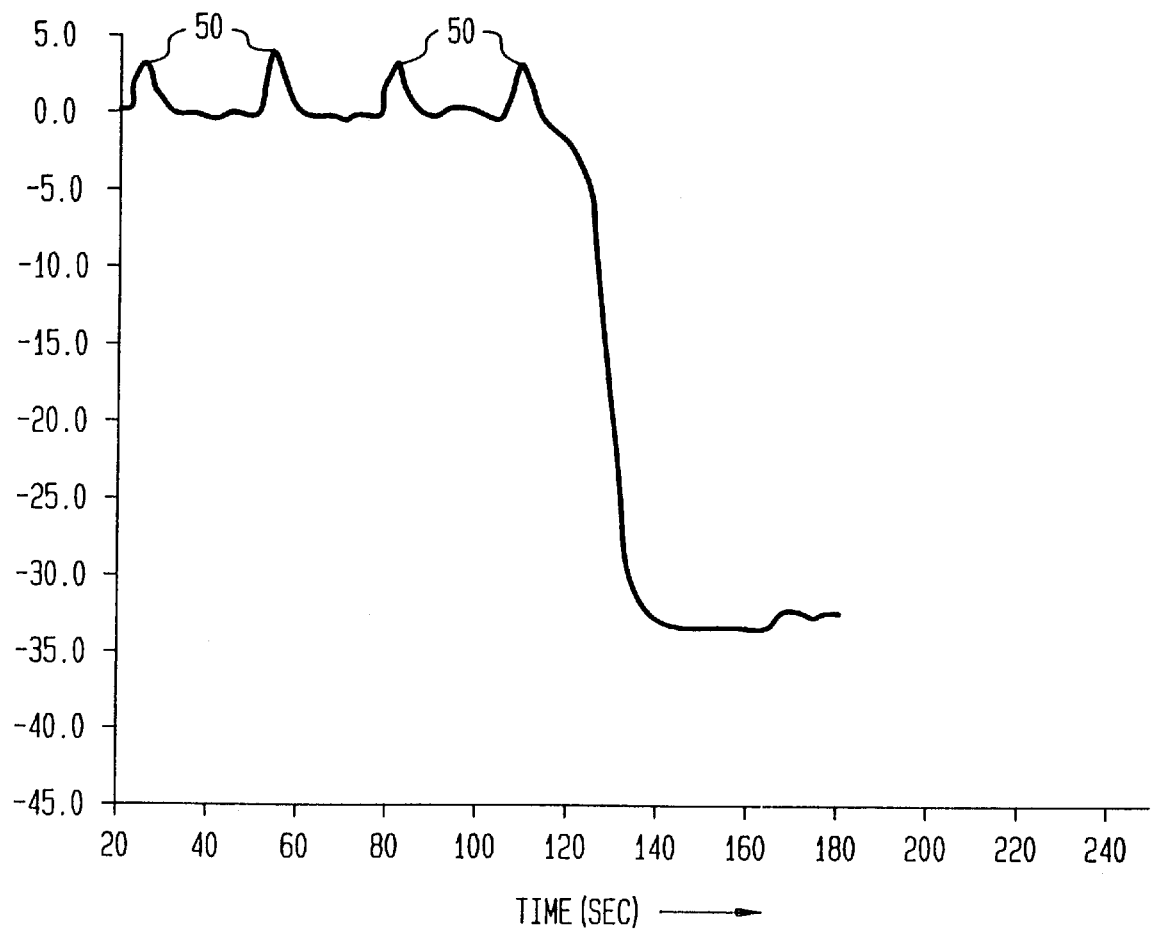

During etching of layer 20 to the desired final thickness, the optical emissions of the plasma at a predetermined wavelength will appear much as in the graph of FIG. 2 as each of the adsorbed gas locations is reached, a sharp peak 50 in the optical emissions will occur. This result is most strongly observed at wavelengths corresponding to carbon and oxygen and it is therefore theorized that the adsorbed ambient gas is principally carbon monoxide. However, it is to be understood that the interface caused by the momentary interruption of the plasma may be no more than a slight crystal dislocation which yields this optical response. The frequency of these peaks reflects the etch rate and the etching is preferably terminated midway between the last two peaks. In this case, the graph of FIG. 2 reflects etching away of four of the locations 25 while the fifth remains within region 40 as seen in FIG. 1. The termination of the reactive ion etching is shown by the sharp decline in the optical emission after approximately 125 seconds of etching.

The assurance of a remaining minimum thickness of layer 20 in etched region 40 indicates the efficacy of the invention to produce increased yields. To demonstrate the accuracy which can be achieved with the present invention, consider a readily etchable material such as molybdenum oxide which is typically etched by RIE at 4500 Angstroms/minute. If a deposited thickness is, say 2000 Angstroms and etching to a thinner layer is required, the entire layer could be etched away in 20–30 seconds. Assuming, rather optimistically, that the etch rate could be held to an accuracy of 15%, if this potential error is projected over the entire film thickness a 15% error would result in a thickness variation of 300 Angstroms. If the etch is carried out in accordance with the invention and five interruptions of the plasma during deposition, the adsorbed gas peaks would appear every 4–5 seconds and the worst case error would thus be 15% of 5 seconds or about 50 Angstroms. With other materials the potential error in blind or timed etching can exceed 750 Angstroms which is sufficient to compromise the formation of conductors. In practice, the accuracy is often much better than the worst case error in which the maximum error is projected over a reduced time interval since the equal or otherwise known separations of locations of adsorbed gas or gases allows substantial inherent compensation for differences in etch rates that may be encountered.

In view of the foregoing, it is seen that a simply and easily produced homogeneous marker may be embedded within the bulk of a deposited material and a relatively simple and straightforward observation made to accurately control the endpoint reached during an etching operation. In fact, such markers can be produced by some types of continuous deposition chambers, such as that schematically shown in FIG. 3, as the plasma is effectively turned on and off as the deposition targets are moved from deposition station to deposition station. For example, in FIG. 3, the portion of the deposition chamber illustrated (excluding the load and exit chambers, not shown) provides for transportation of substrates S and sputtering targets T from deposition station to deposition station indicated with Roman numerals I–V by an endless belt B, each deposition station having a separate source of radio frequency power to drive a plasma. Thus, as the targets T are moved and new substrates loaded at one end and removed from the other, the plasma is periodically interrupted and will form markers in accordance with the invention. Therefore, it is only necessary to control the amount of material deposited at each deposition station and between each marker to achieve the desired accuracy of etch end point.

Figures 3, 4:
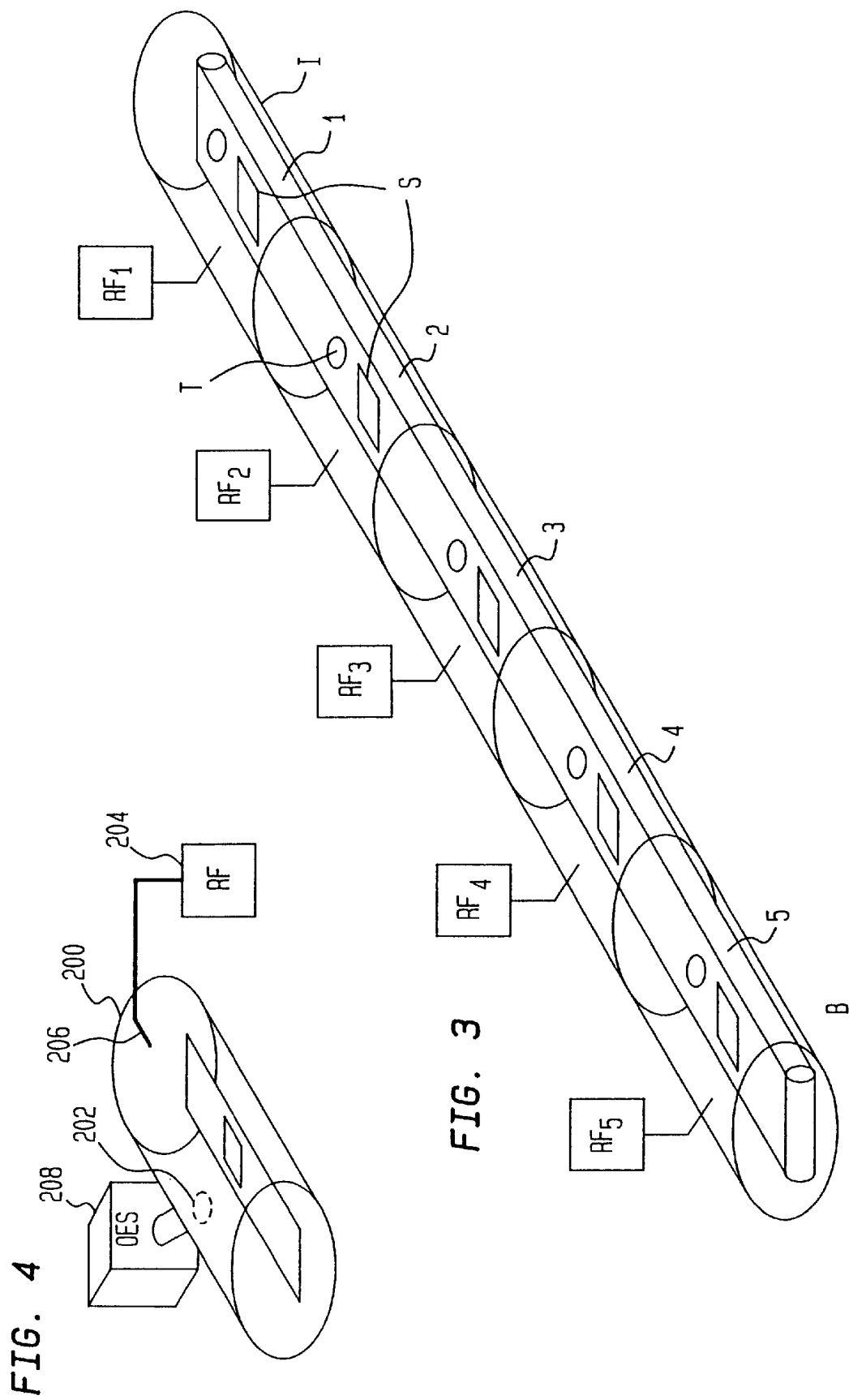
FIG. 3 depicts a multi-station deposition chamber which can advantageously be used in carrying out the invention, and FIG. 4 schematically depicts a chamber for material deposition and/or reactive ion etching in accordance with the invention.

Either deposition or etching could be carried out in the single chamber 200, as shown in FIG. 4; RF power from source 204 being applied to the chamber at antenna 206 or other suitable power coupling means. All that is necessary to practice the invention beyond the normal requisites of RIE is an optical port 202 and apparatus 208 for measuring the optical emissions from the plasma in order to detect peaks 50 as shown in FIG. 2.

While the invention has been described in terms of a single preferred embodiment, those skilled in the art will recognize that the invention can be practiced with modification within the spirit and scope of the appended claims. For example, while the markers have been produced by the adsorption of a gas or gases upon plasma interruption, other markers detectable by OES techniques could be formed from other ambient materials during any other deposition process using a plasma. If such markers involve no more than trace amounts, homogeneity of layer 20 would not be compromised. In such a case, it is preferred that the ambient material forming the marker exhibit a significantly higher or lower etch rate than that of a predetermined material to be deposited in order to have a slight amount thereof be preferentially deposited at the beginning or end of each plasma cycle. Of these two alternatives, the higher etch rate is preferred since a sharper, narrower and more easily distiguishable optical response will result.

What is claimed is:

1. A method of fabricating a semiconductor device including the steps of
    depositing a layer of a predetermined material on a surface in the presence of a plasma,
    periodically interrupting said plasma in the presence of at least one ambient material other than said predetermined material to form a periodic sequence of homogeneous markers within the bulk of said predetermined material,
    etching said predetermined material by reactive ion etching while monitoring optical emissions from a second plasma produced during said reactive ion etching,
    terminating said etching process based on changes in said optical emissions of said second plasma corresponding to said homogeneous markers, and
    allowing at least one homogeneous marker of said homogeneous markers to remain within said predetermined material.

2. A method as recited in claim 1, wherein said ambient material includes at least one of carbon and oxygen.

3. A method as recited in claim 1, wherein said depositing step is a plasma enhanced chemical vapor deposition process.

4. The method as in claim 1, wherein said homogeneous markers each comprise trace amounts of said ambient material.

5. The method as in claim 1, wherein said homogeneous markers each comprise a dislocation of a crystal structure of said predetermined material and trace amounts of said ambient material.

6. The method as in claim 1, wherein said homogeneous markers do not effect an etch rate or an optical characteristic of said predetermined material.

7. The method as in claim 1, wherein said interrupting step comprises stopping said depositing step for approximately one second.

8. A method of fabricating a semiconductor device comprising steps of:
    depositing a layer of a first material on a surface for a first period in the presence of an second material;
    interrupting said depositing step for a second period to allow said first material to absorb said second material to form a homogeneous marker within said first material;
    repeating said depositing step and said interrupting step to form multiple homogeneous markers at different depths within said first material;
    etching said first material and thereby producing emissions;
    monitoring said emissions to individually detect the etching of each of said homogenous markers by the presence or absence of a characteristic associated with said second material;
    stopping etching between two adjacent homogeneous markers of said homogeneous markers.

9. The method as in claim 8, wherein said homogeneous marker comprises trace amounts of said second material.

10. The method as in claim 8, wherein said homogeneous marker comprises a dislocation of a crystal structure of said first material and trace amounts of said second material.

11. The method as in claim 8, wherein said homogeneous layer does not effect an etch rate or an optical characteristic of said first material.

12. The method as in claim 8, wherein said second period is approximately one second.

13. The method as in claim 8, wherein said depositing step comprises depositing said first material by a plasma enhanced chemical vapor deposition process.

14. The method as in claim 8, wherein said etching step comprises reactive ion etching.

* * * * *